(12) United States Patent
Ionescu et al.

(10) Patent No.: US 9,652,011 B2
(45) Date of Patent: *May 16, 2017

(54) SYSTEMS AND METHODS FOR STORING INFORMATION

(71) Applicant: Infineon Technologies AG, Neubiberg (DE)

(72) Inventors: Mihai-Alexandru Ionescu, Villach (AT); Christoph Schroers, Villach (AT); Davide Cassata, Villach (AT); Hubert Fischer, Moosburg (AT); Wolfgang Horn, Klagenfurt (AT); Razvan-Catalin Mialtu, Pitesti (RO); Radu Mihaescu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 83 days.

This patent is subject to a terminal disclaimer.

(21) Appl. No.: 14/513,356

(22) Filed: Oct. 14, 2014

(65) Prior Publication Data

US 2015/0033085 A1 Jan. 29, 2015

Related U.S. Application Data

(63) Continuation-in-part of application No. 13/651,930, filed on Oct. 15, 2012, now Pat. No. 8,862,949.

(51) Int. Cl.
*G06F 11/00* (2006.01)
*G06F 1/30* (2006.01)
(Continued)

(52) U.S. Cl.
CPC ............... *G06F 1/30* (2013.01); *G01D 3/022* (2013.01); *G01D 9/005* (2013.01); *G01D 9/06* (2013.01);
(Continued)

(58) Field of Classification Search
CPC .............................. G06F 11/0787; G06F 1/30
(Continued)

(56) References Cited

U.S. PATENT DOCUMENTS 5,721,855 A 2/1998 Hinton et al.
7,000,146 B2 * 2/2006 Mackey .................... G06F 1/30
713/340

(Continued)

OTHER PUBLICATIONS

Infineon Technologies AG, "Sensor Solutions for Automotice and Industrial Applications", © 2012, 40 pgs, as available at http://www.infineon.com/dgdl/sensor+solutions+for+automotive+and+industrial-2012_final.pdf?folderID=db3a30431689f4420116a096e1db033e&fileId=db3a30433a047ba0013a4137abc84020.
(Continued)

*Primary Examiner* — Dieu-Minh Le
(74) *Attorney, Agent, or Firm* — Schiff Hardin LLP

(57) ABSTRACT

Embodiments relate to multi-contact sensor devices and operating methods thereof that can reduce or eliminate offset error. In embodiments, sensor devices can comprise three or more contacts, and multiple such sensor devices can be combined. The sensor devices can comprise Hall sensor devices, such as vertical Hall devices, or other sensor types in embodiments. Operating modes can be implemented for the multi-contact sensor devices which offer significant modifications of and improvements over conventional spinning current principles, including reduced residual offset.

18 Claims, 6 Drawing Sheets

(51) Int. Cl.
*G01D 3/02* (2006.01)
*G01D 9/00* (2006.01)
*G01D 9/06* (2006.01)
*G01D 18/00* (2006.01)
*G11C 29/52* (2006.01)
*G11C 29/04* (2006.01)
*G11C 29/44* (2006.01)

(52) U.S. Cl.
CPC .......... *G01D 18/008* (2013.01); *G11C 29/52* (2013.01); *G11C 2029/0409* (2013.01); *G11C 2029/4402* (2013.01)

(58) Field of Classification Search
USPC .............. 714/48, 23, 30, 31, 32, 34, 734, 14
See application file for complete search history.

(56) References Cited

U.S. PATENT DOCUMENTS

| | | | |
|---|---|---|---|
| 7,289,375 B2 | 10/2007 | Fukui | |
| 7,428,132 B1 * | 9/2008 | Radosavljevic | H01H 71/20 324/509 |
| 2006/0174148 A1 * | 8/2006 | Yang | G06F 1/3203 713/322 |
| 2007/0234153 A1 | 10/2007 | Kawasaki | |
| 2010/0052424 A1 | 3/2010 | Taylor et al. | |
| 2012/0063524 A1 | 3/2012 | Stott et al. | |
| 2012/0105112 A1 * | 5/2012 | Davis | G06F 11/1604 327/142 |
| 2013/0187686 A1 * | 7/2013 | Yuan | H03K 3/0375 327/117 |
| 2014/0055179 A1 * | 2/2014 | Gong | H03L 7/081 327/156 |

OTHER PUBLICATIONS

Infineon Technologies AG, "TLE4997 Programmable Linear Hall Sensor", Sep. 2008, Version 2.08, as available at http://www.infineon.com/dgdl/TLE4997_Data_Sheet_v2.08.pdf?folderID=db3a30431ce5fb52011d3dd6e8012582&fileId=db3a30431ce5fb52011d3e4c832a2594.

* cited by examiner

SYSTEMS AND METHODS FOR STORING INFORMATION

TECHNICAL FIELD

The invention relates generally to integrated circuits and more particularly to storing calibration and other information by integrated circuit sensor devices.

BACKGROUND

Sensor devices often need to store information or data internally for use by the sensor at certain times or in the occurrence of certain events. For example, magnetic field sensors often generate and store calibration information for use at start-up or some other time.

This stored information can be lost, however, if the sensor device experiences a reset event or loss of power. Returning to the magnetic field sensor example, these sensors are often used in automotive applications, such as fuel injection and other engine systems, where they can be exposed to significant electromagnetic interference, voltage spikes related to engine starts and stops or other sources, or other power interruptions. These interruptions can cause the supply line voltage to drop below the minimum necessary for the sensor, even for a very brief period of time, causing the sensor to reset and current calibration information to be lost. This is undesirable because a cold start of the sensor requires a calibration procedure, which takes additional time and cannot take into account calibration information obtained during actual operation conditions, which can capture, e.g., temperature and other real-time characteristics which vary from start-up or generally over time.

A related problem is corruption of calibration information. If the sensor is writing to memory when a loss of power or reset occurs, the information may nevertheless be written to memory but that information may be incomplete or corrupted. Even if the sensor is able to maintain the information after the power interruption, such as by using an external capacitor as a source of power, the sensor cannot know that the information is unreliable or uncorrupted. Using that information can lead to reduced performance or errors in the sensor, which are undesirable for obvious reasons.

BRIEF DESCRIPTION OF THE DRAWINGS

The invention may be more completely understood in consideration of the following detailed description of various embodiments of the invention in connection with the accompanying drawings, in which.

Figure 1:
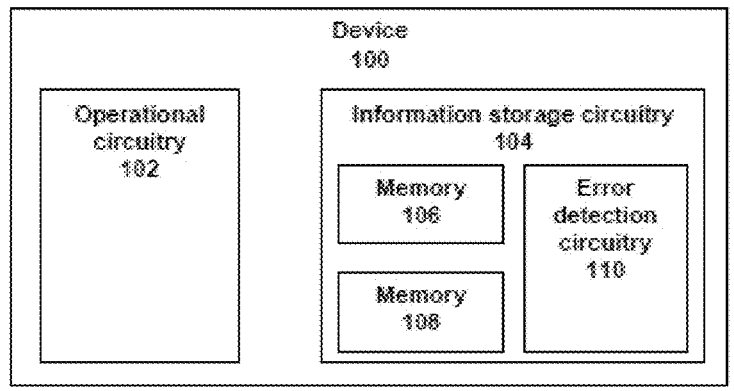
FIG. 1 is a block diagram of a device comprising information storage circuitry according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to reliably storing information in a sensor or other device. In an embodiment, information storage circuitry comprises independent, redundant memory portions and error detection circuitry. The circuit can operate in cooperation with a memory writing procedure that utilizes a validity bit and sequentially writes to one or the other of the redundant memory portions such that at least one of the memory portions has data which is valid and can be recognized as such.

Referring to FIG. 1, a block diagram of a device 100 is depicted. In general, device 100 is a functional device having operational circuitry 102 for carrying out its function(s). Operational circuitry 102 can comprise a microcontroller and other circuitry necessary for device 100 to generally operate. For example, device 100 can comprise a sensor in embodiments, such as a magnetic field sensor, current sensor, temperature sensor, acceleration sensor, or some other type of sensor, wherein operational circuitry 102 comprises sensor circuitry. In other embodiments, device 100 can comprise some other device, such as a voltage regulator; transducer, such as magnetic or pressure; signal path; digital control; output driver; or other parts of an integrated circuit device. For convenience herein, device 100 will be discussed in the context of a magnetic field sensor device, though this discussion is not to be considered limiting or limited to magnetic field sensor devices.

Device 100 also comprises information storage circuitry 104. Information storage circuitry 104 can be used within device 100 to store information utilized by operational circuitry 102 during operation, such as calibration data, output values or other information. In embodiments, circuitry 104 also can be used to verify whether information stored therein is valid. For example, some magnetic field sensor devices store calibration information during operation, and that information can be used by operational circuitry 102 if device 100 is reset, restarted, experiences a power spike or disruption or if some other event occurs affecting regular operation of device 100. Using that stored information can enable a faster restart and more accurate and reliable operation in embodiments, rather than using default information or waiting to acquire new information, which in embodiments may not be possible if the information is required in order to properly start up. If that stored information is not valid, however, because it was being written to memory 106 or 108 when a loss of power or other event occurred, or for some other reason, additional errors can occur within device 100. Therefore, information storage circuitry 104 also can verify whether the stored information is valid before it is used by operational circuitry 102.

In embodiments, information storage circuitry 104 comprises redundant memory portions 106 and 108 and error detection circuitry 110. Memory portions 106 and 108 can one or more comprise latches, registers or other suitable memory circuitry in embodiments. Error detection circuitry 110 comprises reset circuitry that enables a determination of whether a loss of power event has exceeded a maximum time such that a minimum necessary voltage required for information to be reliably stored in memory portions 106 and 108 has dissipated. If the information stored in memory portions 106 and 108 can no longer be considered to be reliable because the voltage level has fallen too far, the reset circuitry can reset memory portions 106 and 108.

Figure 2:
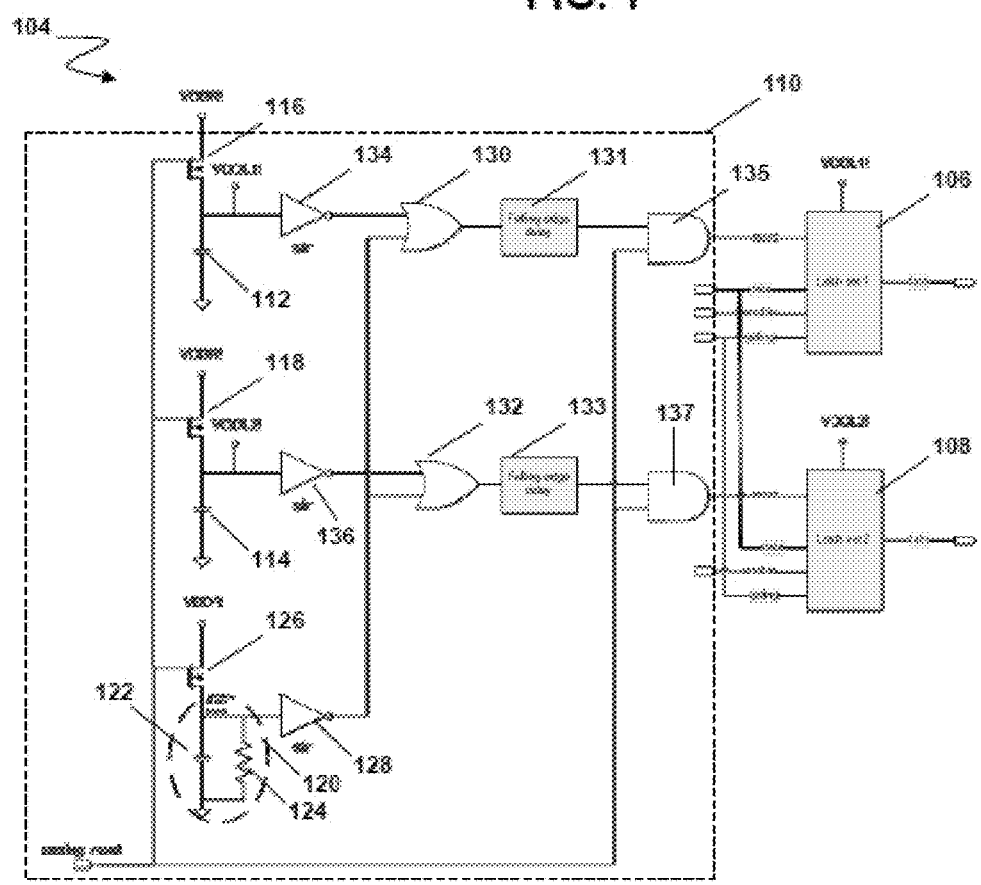
FIG. 2 is a circuit block diagram of the information storage circuitry of FIG. 1.

Referring to FIG. 2, an embodiment of information storage circuitry 104 is depicted in more detail. In the embodiment of FIG. 2, each memory portion 106 and 108 comprises a set of latches, which are depicted in more detail in FIG. 4 and will be discussed below. Each memory portion 106 and 108 is coupled to its own voltage supply domain, VDDL1 and VDDL2, respectively. The voltage at VDDL1 and VDD2 can vary in embodiments, such as according to an application. For example, VDDL1 and VDDL2 can be about 2.5 V to about 3.5 V in embodiments, with external supply voltages being about 3.5 V, about 12 V, about 48 V, or some other voltage level in other embodiments. Each supply domain VDDL1 and VDDL2 comprises a capacitor 112 and 114, respectively, used to store energy and supply power to its respective memory portion 106 and 108 during short power-downs or other losses of power to device 100. In one embodiment, each capacitor 112 and 114 comprises a 60 pF integrated capacitor, though the size of capacitors 112 and 114 can vary in other embodiments. Larger capacitors 112 and 114, for example, would generally increase storage times during losses of power and therefore can vary in embodiments, though larger capacitors will generally be more expensive in cost and area. Each supply domain VDDL1 and VDDL2 is also coupled to a regulated power supply VDDR by switches 116 and 118. In one embodiment, each switch 116 and 118 comprises a transistor, such as an nMOS transistor. Switches 116 and 118 are controlled by an analog reset of device 100. Thus, so long as VDDR is above the reset threshold, VDDL1 and VDDL2 are coupled to VDDR. If VDDR falls below the reset threshold, VDDL1 and VDDL2 will be disconnected from VDDR by switches 116 and 118 and supplied with power only via capacitors 112 and 114.

Figure 3:
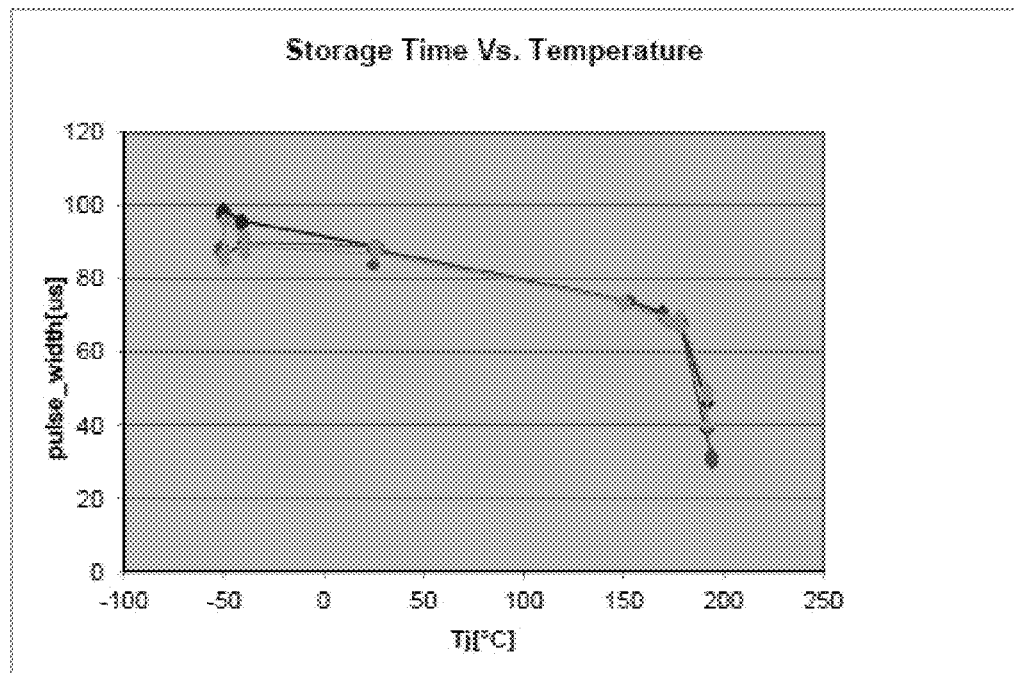
FIG. 3 is a plot of storage time versus temperature according to an embodiment.

When VDDL1 and VDDL2, and thus memory portions 106 and 108, respectively, are discharged via the leakage current of internal transistors, the time during which the information stored in memory portions 106 and 108 remains reliable decreases exponentially as temperature increases. Refer, for example, to FIG. 3, which is a graph of storage times versus temperature from one test implementation. As can be seen, the storage time, measured here in μ-seconds, decreases generally as temperature increases, and decreases rapidly beginning about 150 degrees C. Because it is desired to better monitor the length of time for which memory portions 106 and 108 are reliant on capacitors 112 and 114 for power in order to better determine whether stored information is reliable, and the temperature is difficult to control given the operating characteristics, environment and other factors affecting device 100, circuitry 104 also comprises a time-constant reset circuit 120. Time-constant reset circuit 120 comprises a capacitor 122 and a resistor 124 connected in parallel. In one embodiment, capacitor 122 is about 20 pF and resistor 124 is about 3 mega-Ohms (Me), though these values can vary in other embodiments. Resistor 124 functions as a discharge resistor, such that when capacitor 122 is disconnected from VDDR by a switch 126 coupled to the analog reset, capacitor 122 begins to discharge through resistor 124. The discharge time of resistor 124 is less variable with temperature than that of capacitors 112 and 114, such that the elapsed time can be better monitored according to the power that has been discharged from capacitor 122 by resistor 124. At the next start-up of device 100, a comparator 128, such as a Schmitt trigger, is used to sense the voltage level at capacitor 122 and compare that voltage to a threshold. If the voltage is below the threshold, such as about 1.0 to about 1.2 V in an embodiment, the time during which information can be reliably stored in memory portions 106 and 108 has been exceeded, and memory portions 106 and 108 are reset via OR gates 130 and 132, respectively, at the same time VDDL1 and VDDL2 are reconnected to VDDR. The reset pulse length is increased with the help of falling edge delays (discussed below with respect to an embodiment comprises falling edge delay circuits 131 and 133) so the reset signal is reliable. Capacitor 122, as well as capacitors 112 and 114, is then recharged. The voltage threshold used by comparator 128 can vary in other embodiments, being lower or higher based on technology, application and/or other components of circuitry 104.

In addition to being coupled to comparator 128, OR gates 130 and 132 are each also coupled to other comparator 134 and 136, respectively, each associated with one of memory portions 106 and 108. Comparators 134 and 136 also can be Schmitt triggers in embodiments. These comparators 134 and 136 can be viewed as implementing a fail safe mode, similarly to comparator 128: at the next start-up following a loss of power or other event, comparators 134 and 136 can be used to sense the voltage at VDDL1 and VDDL2, respectively, and if the voltage is below a threshold, memory portions 106 and 108 will be reset. Because OR gates 130 and 132 are each coupled to a comparators 134 or 136, respectively, and to comparator 128, a reset at either a respective memory portion 106 or 108 will reset that memory portion 106 or 108. A reset from time-constant reset circuit 120, as can be seen in FIG. 2, will reset both memory portions 106 and 108. AND gates 135 and 137 also are used as protection to avoid parasitic spikes that could be seen as reset signals to reset memory portions 106 or 108.

Circuitry 104 also comprises falling edge delay circuits 131 and 133 in an embodiment. In embodiments, circuits 131 and 133 can be used to generate a cleaner pulse shape though are optional. In embodiments, a reset pulse can be about 10 ns, which may not be enough to reliably trigger a reset. Circuits 131 and 133 lengthen the pulse, or delay the falling edge, such that a more reliable reset pulse is generated. For example, in an embodiment circuits 131 and 133 can increase the length of a reset pulse from about 10 ns to about 50 ns. AND gates 135 and 137 are respectively coupled between circuits 131 and 133 (or OR gates 130 and 132, respectively, in embodiments in which circuits 131 and 133 are omitted) as well as to an analog reset, such that a reset at either reset portion, that associated with memory portion 106 or that associated with memory portion 108, will trigger a reset of that memory portion 106 or 108 so long as the analog reset signal is low, as the analog reset from the chip reset functions as a gating signal, disabling any possible reset from comparators 134, 136 and/or 128 so long as it is low.

Figure 4:
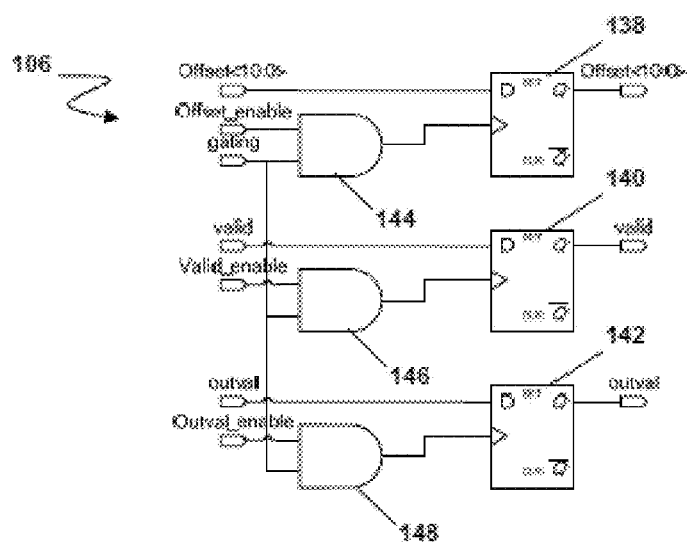
FIG. 4 is a block diagram of a memory portion of FIGS. 1 and 2.

Referring also to FIG. 4, one embodiment of a memory portion 106 is depicted. Though only memory portion 106 is depicted, in general memory portion 108 will be the same. In various embodiments, memory portions 106 and 108 generally will have the same structure as one another, though that structure can differ from what is depicted in the embodiment of FIG. 3. In FIG. 3, memory portion 106 comprises a set of three latches 138, 140 and 142. Latches 138 and 142 store information bits, and latch 140 stores an error detection or validity bit. The particular number, arrangement and data storage configuration of latches 138, 140 and 142 can vary in embodiments from that depicted as an example in FIG. 3. Latches 138, 140 and 142 can only be written to in an embodiment if the gating pin of each, which are coupled to each other as well as to the analog reset, is high. Each latch 138, 140 and 142 also comprises a write enable, depicted as Offset_enable, Valid_enable and Outval_enable, respectively. The write enable and the gating pin of each latch 138, 140 and 142 are coupled to an AND gate 144, 146 and 148.

Figure 5:
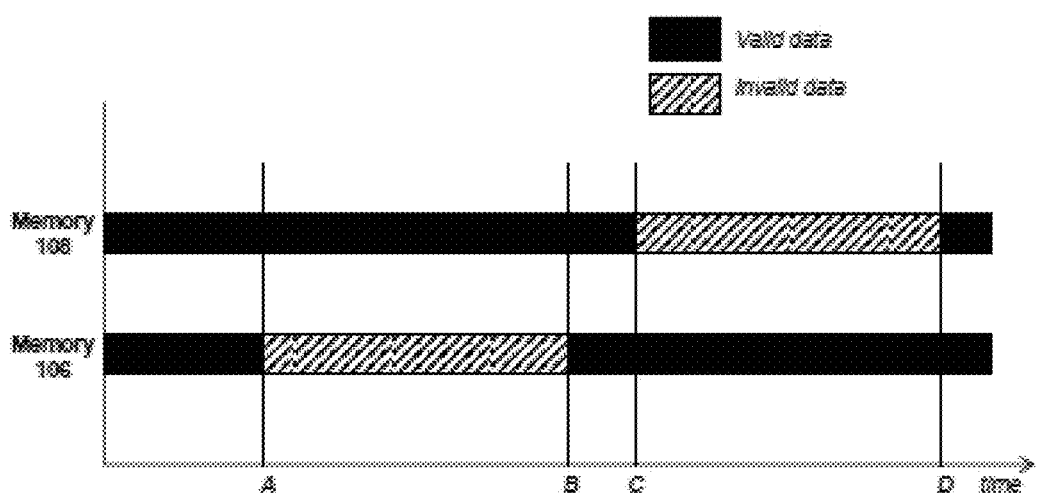
FIG. 5 is a write timing diagram according to an embodiment.
Figure 6:
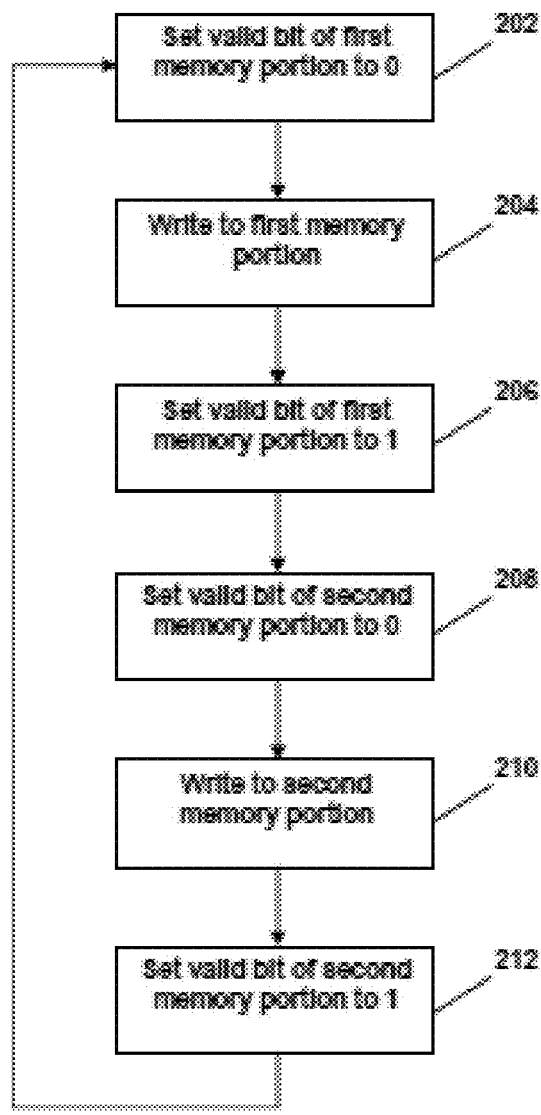
FIG. 6 is a flowchart of a write process according to an embodiment.

In embodiments, a unique write procedure is used with circuitry 104 in order to reliably write information to and store information in memory portions 106 and 108. The write procedure ensures that valid data is stored in at least one of the memory portions 106 and 108, available to device 100, even if a reset occurs during a write process to one or the other. Referring to FIGS. 5 and 6, at A (FIG. 5) and 202 (FIG. 6) the validity bit of memory portion 106 is set to 0. Information is then written to memory portion 106 at 204, but the information is not valid until the writing is complete. At B and 206, the validity bit of memory portion 106 is set to 1, meaning a successful write was completed and the information stored in memory portion 106 is valid beginning at B. At C and 208, the validity bit of memory portion 108 is set to 0, and information is written to memory portion 108 at 210. The time elapsed between B and C is on the order of a few microseconds or less in embodiments, though this can vary in other embodiments. At D and 212, the validity bit of memory portion 108 is set to 1, meaning a successful write was completed and the information stored in memory portion 106 is valid beginning at D. The process then can repeat itself from 202.

Thus, valid data should always be present in at least one of the memory portions 106 and 108, identifiable as such by the validity bit of that memory portion. Information is written to only one memory portion 106 or 108 at a time, and if a loss of power or other interruption occurs during the write, the validity bit for that memory portion 106 or 108 will not be valid. It will either be a 0 or in a meta-stable state, neither a 0 nor a 1. In a meta-stable state, the internal nodes of latch 140 are between 0 and 1, which will cause capacitor 112 or 118 to discharge rapidly, triggering a reset by Schmitt trigger 134 or 136 at the next start up. If the validity bit is a 0, it will be checked at the next start-up by digital logic in device 100 and that memory portion 106 or 108 reset, and information from the other memory portion 106 or 108 will be used. This sequential writing procedure ensures that one of memory portions 106 or 108 will have valid data for use at the next start-up of device 100.

Figure 7:
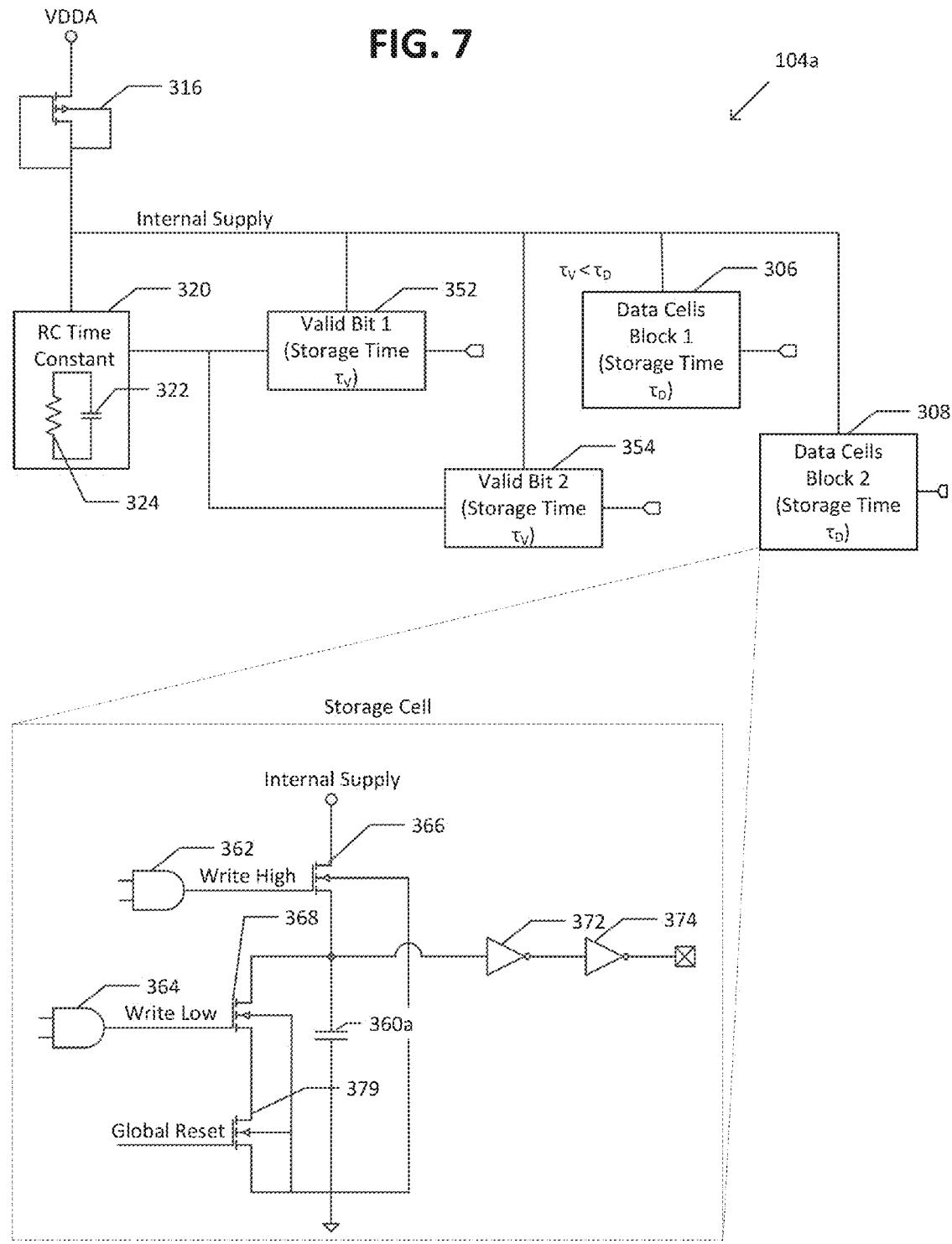
FIG. 7 is a circuit block diagram of the information storage circuitry of FIG. 1 according to an alternative embodiment.

FIG. 7 is a circuit block diagram of the information storage circuitry 104a of FIG. 1 according to an alternative embodiment. The embodiments of FIGS. 2 and 7 are similar in that they each have a same writing procedure. A main difference between the embodiments of FIGS. 2 and 7 is the configuration of the storage cells, as will be described in detail below.

The information storage circuitry 104a includes a first data cell block 306 configured to store information, a redundant second data cell block 308 configured to store information, and an error detection portion. The information may be, for example, calibration information. First data cell block 306 and second data cell block 308 replace the first latch set 106 and second latch set 108, respectively, of FIG. 2, but do not include valid bits.

The error detection portion includes a first valid bit circuit 352 and a second valid bit circuit 354. The first valid bit circuit 352 configured to reset or to mark as invalid the first data cell block 306 when the first error valid bit circuit 352 detects an error in the first data cell block 306. The second valid bit circuit 354 is configured to reset or to mark as invalid the second data cell block 308 when the second valid bit circuit 354 detects an error in the second data cell block 308.

Each of the first and second data cell blocks 306, 308 comprises a plurality of storage cells. One of the storage cells is shown in FIG. 7 in detail. Each data cell block 306, 308 may have, for example, twelve individual storage cells, though the disclosure is not limited in this regard. There may be any number of storage cells suitable for the intended purpose The storage cells of each of the first and second data cell blocks 306, 308, and the first and second valid bit circuits 352, 354 have a same structure, except that the capacitors of the storage cells have a different size than the capacitors of the first and second valid bit circuits 352, 354. More specifically, each of the storage cells has a first capacitor 360a having a first capacitance and a storage time of $\tau_V$, and each of the first and second valid bit circuits 352, 354 comprises a second capacitor 360b (not shown) having a second capacitance and a storage time of $\tau_D$. The first capacitance is greater than the second capacitance such that second capacitor 360b has a shorter storage time and thus a faster discharge time than the first capacitor 360a.

The storage cells and the first and second valid bit circuits 352, 354 otherwise have a same structure. More specifically, each of the storage cells and the first and second valid bit circuits 352, 354 has first and second switches 366, 368, first and second AND gates 362, 364 and a third switch 370. The first switch 366 is coupled between an internal supply and the first/second capacitor 360 (the first capacitor 360a is of the storage cell, and the second capacitor 360b is of the first and second valid bit circuits 352, 354). The first AND gate 362 has an information input, a gating input, and a write high output coupled to the first switch 366. The first AND gate 362 is configured to write a logic 1 in its corresponding memory cell. The third switch 370 is configured to provide a global reset, which is a sum of all circuit resets.

The second switch 368 is coupled between the storage cell output and ground. The second switch 368 is coupled in parallel with the first/second capacitor 360, and is also coupled between the storage cell output and the third switch 379, which is in turn coupled to ground. The second AND gate 364 has a data input, a gating input, and a write low output coupled to a second switch 368. The second AND gate is configured to store a logic 0 in its corresponding memory cell.

The two NOT gates 372, 374 of the storage cell function to shape the output signal. When the capacitor 360 starts to discharge, there will not be a purely digital signal of the capacitance. The NOT gates 372, 374 transform the voltage of the capacitor 360 into a digital voltage. The global reset 370 of the third switch 370 functions to combine of all the resets from all of the supplies in the device 100.

If no data is to be stored in the storage cell, the signal at the information inputs to both first and second AND gates 362, 364 are a logic 0, that is, low. If data is to be written, the signal at the information input of one of the first and second AND gates 362, 364 changes to a logic 1, that is, high. More specifically, if a logic 1 is to be stored in the data storage cell, the information input of AND gate 362 is logic 1, which opens the switch 366 and couples the capacitor 360 to the internal supply. If a logic 0 is to be stored in the data storage cell, the information input of AND gate 364 is logic 1, and the switch 368 coupled to the output will discharge the capacitor 360 to ground. The gating input of each of the AND gates 362, 364 is coupled to the analog reset shown in FIG. 2 and indicates when there is not enough supply; in such a case, any signal at the information inputs of the AND gates 362, 364 is not permitted to pass to thereby prevent bad information from being written to the data storage cells.

A time-constant reset circuit 320 is coupled to both the first and second data cell blocks 306, 308, and is configured to reset the first and second data cell blocks 306, 308 after a predetermined period of time. Time-constant reset circuit 320 includes a capacitor 322 and resistor 324 coupled in parallel. This is similar to the time-constant reset circuit 120 of FIG. 2.

Turning back to the main circuit 104a, a switch 316 is coupled between the general supply VDDA of the device 100 and the internal supply. The switch 316 comprises a transistor, such as an nMOS transistor, and is controlled by the device 100's analog reset. This is also similar to the embodiment of FIG. 2.

The first and second valid bits 352, 254 maintain the functionality of the valid bits of the embodiment of FIG. 2, that is, each valid bit is written to logic 0 before data is written and written back to logic 1 after the data is written. However, in this embodiment, the valid bits additionally include a low voltage detection function to determine whether the voltage of the capacitor 360 in the valid bit circuit 352 is high enough to indicate that the information in the storage cells is still accurate. This function is accomplished by each of the first and second valid bits 352, 354 have the same structure as the storage cells of the data cell blocks 306, 308, but the first and second valid bit circuits 352, 354 have smaller capacitors 360b. This means that the capacitors 360b of the first and second validate bit circuits 352, 254 will discharge faster than the capacitors 360 of the storage cells, and thus by the time the capacitors of the valid bit circuits 352, 354 discharge enough to have a low voltage, it is assumed that the larger capacitors 360a of the storage cells still have enough voltage to maintain the stored information as accurate.

The detection of the capacitor voltages in the previous embodiment of FIG. 2 is direct because the Schmitt triggers 134, 136 are directly coupled to the storage capacitors 112, 114. In this embodiment, on the other hand, the detection is indirect in that the detection is not performed on the storage cell directly, but is instead based on an equivalent circuit of the valid bit circuits 352, 354 differing from the storage cell only in the size of the capacitors 360.

The embodiments of FIGS. 2 and 7 also in that in the embodiment of FIG. 2, each of the latch sets 106, 108 are supplied by a single capacitor 112, 114. More specifically, the storage cells of the latch set 106 are all supplied from a single capacitor 112, and the storage cells of the latch set are all supplied from a single capacitor 114. In contrast, in the embodiment of FIG. 7, each of the individual storage cells in the first and second data cell blocks 306, 308 are supplied by its own capacitor 360. Capacitors 360 are smaller than capacitors 112 and 114 of FIG. 2 yet achieve the same storage time. Device 100 can therefore be smaller, by three times or more, leading to a reduced manufacturing cost.

Referring back to FIG. 1, the device 100 includes an information storage circuit 104, 104a (discussed above) and operational circuitry 102. The information storage circuit 104, 104a is configured to store a measured physical quantity, such as any of a magnetic field, current, pressure, temperature, acceleration, etc. The operational circuitry 102 is configured to perform operational processing using the measured physical quantity. The device 100, and/or the system comprising the device, may be at least one of a single unit, an integrated circuit, a digital signal processor, a microcontroller, and a plurality of circuits within a single housing (e.g., two dies within a single integrated circuit package).

The device 100 is configured to perform a predefined startup procedure only at a first startup. This startup procedure may be, for example, a calibration procedure. The device 100 in this example starts up, calibrates, performs an operation, powers down, starts up again, performs an operation, powers down, starts up, performs another operation, powers down, etc.; the calibration is performed only after the first startup.

A first startup is defined as when a last power-down time of the device 100 is greater than a predetermined period of time. This predetermined period of time may be on the order of microseconds, though the disclosure is not limited in this regard. If the power down lasts a long time, such as milliseconds or seconds, the startup is considered a cold start, and the calibration much be performed as the stored calibration data is likely no longer valid. On the other hand, if the power down lasts a short time, such as in the order the order of microseconds, the startup is considered to be a warm startup; the stored calibration information is likely still valid, so there is no need to perform another calibration. This predetermined period of time maybe the same or less than a period of time the information may be stored without a power supply.

Figure 8:
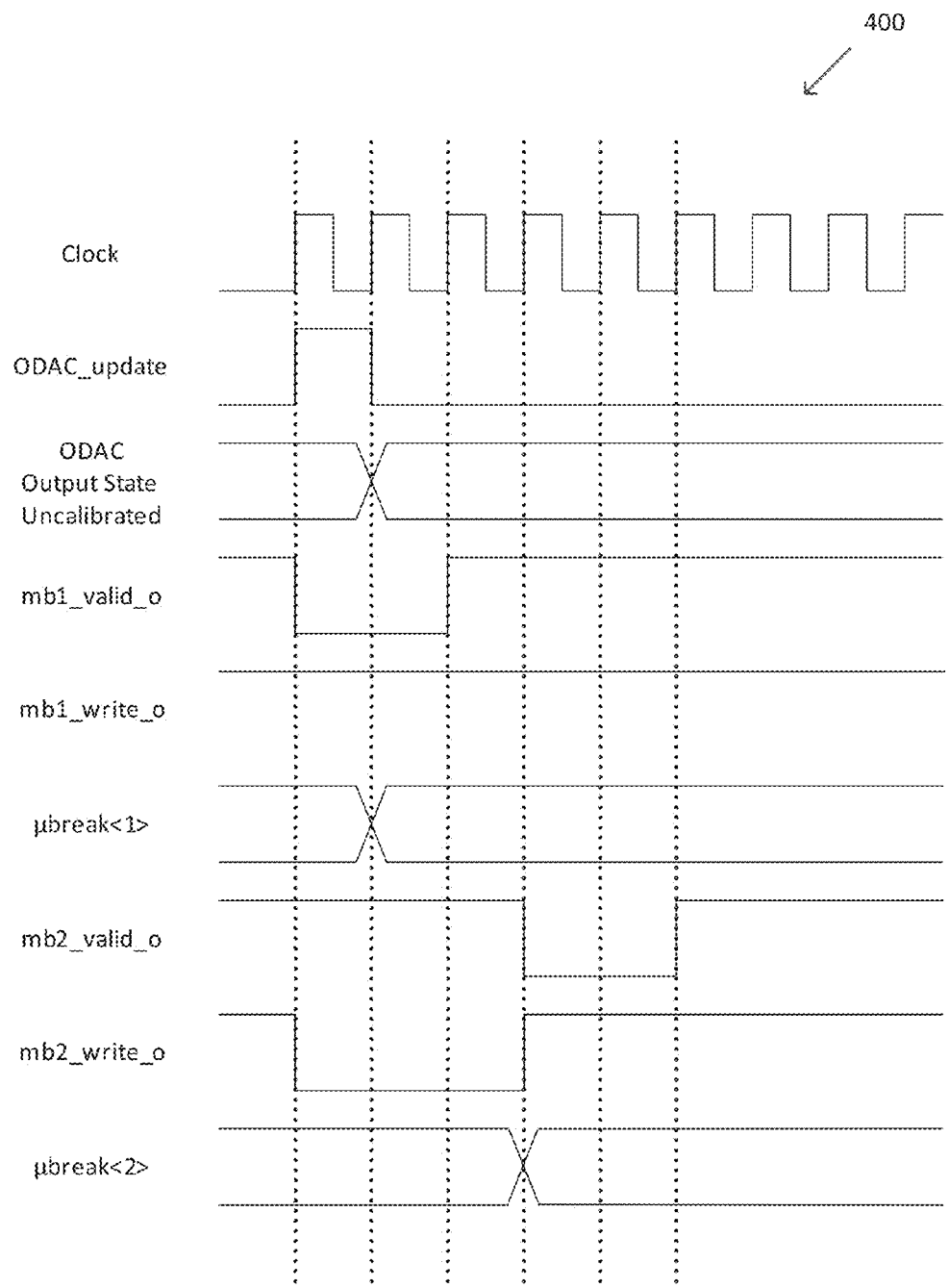
FIG. 8 is a write timing diagram according to the embodiment of FIG. 7.

FIG. 8 is a write timing diagram 400 according to the embodiment of FIG. 7. The clock signal represents the system clock. The "ODAC_update" represents when the stored information needs to be updated. "ODAC" is an acronym for "Offset Digital-to-Analog Converter". "ODAC Output State Uncalibrated" has a crossing which represents when the calibration process is being performed.

"mb1_valid_0" represents when the data in the first data cell block 306 is valid. Similarly, "mb1_valid_0" represents when the data in the second data cell block 308 is valid. "mb1_write_0" represents when the data in the first data cell block 306 is being written. Similarly, "mb1_write_0" represents when the data in the second data cell block 308 is being written. "µbreak<1>" represents the output of the first data cell block 306. Similarly, "µbreak<2>" represents the output of the second data cell block 308. The crossing of the lines is when the data is being modified.

Embodiments thereby provide devices, integrated circuits, systems and methods for reliably storing information and for determining if information is no longer reliable because of elapsed time or for some other reason. Embodiments comprise redundant memory portions and utilize a unique writing procedure in order to ensure that valid data is present in at least one of the memory portions. Embodiments thereby provide consistent access to reliable information, enabling faster start-up, restart, calibration and other operations of devices.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An information storage circuit, comprising:
   a first memory portion configured to store information;
   a second memory portion configured to store information; and
   an error detection portion comprising:
      a reset circuit coupled to the first memory portion, and configured to reset the first memory portion after a predetermined period of time;
      a first error detection circuit coupled to the first memory portion, and configured to reset the first memory portion when the first error detection circuit detects an error in the first memory portion; and
      a second error detection circuit coupled to the second memory portion, and configured to reset the second memory portion when the second error detection circuit detects an error in the second memory portion.

2. The information storage circuit of claim 1, wherein the reset circuit is a time-constant reset circuit coupled to both the first and second memory portions, and is configured to reset the first and second memory portions after the predetermined period of time.

3. The information storage circuit of claim 2, wherein the time-constant reset circuit comprises:
   a capacitor coupled in parallel with a resistor; and
   a comparator configured to reset the first and second memory portions if a voltage of the capacitor is less than a threshold.

4. The information storage circuit of claim 1, wherein:
   the first memory portion comprises a first validity bit, and
   the second memory portion comprises a second validity bit.

5. The information storage circuit of claim 4, wherein data is written to the first and second memory portions sequentially, and wherein each of the first and second validity bits of the first and second memory portions, respectively, is set to a first value before the writing is taking place and is set to a second value when the writing is concluded.

6. The information storage circuit of claim 1, wherein:
   the first error detection circuit comprises a first capacitor, and the first memory portion comprises a plurality of storage cells configured to be supplied by the first capacitor, and
   the second error detection circuit comprises a second capacitor, and the second memory portion comprises a plurality of storage cells configured to be supplied by the second capacitor.

7. The information storage circuit of claim 1, wherein:
   the first error detection circuit comprises a first capacitor and a first comparator configured to reset the first memory portion if a voltage of the first capacitor is less than a first threshold, and
   the second error detection circuit comprises a second capacitor and a second comparator configured to reset the second memory portion if a voltage of the second capacitor is less than a second threshold.

8. The information storage circuit of claim 1, further comprising:
   a first edge delay circuit coupled between the first memory portion and the first error detection circuit, and configured to delay a second edge of a reset pulse to reset the first memory portion; and
   a second edge delay circuit coupled between the second memory portion and the second error detection circuit, and configured to delay a second edge of a reset pulse to reset the second memory portion.

9. The information storage circuit of claim 1, wherein each of the first and second memory portions comprises a set of latches or registers.

10. The information storage circuit of claim 9, wherein each of the sets of latches is configured to store information and the respective validity bit.

11. The information storage circuit of claim 1, wherein the error is an interruption of power.

12. The information storage circuit of claim 1, wherein:
   the first error detection circuit comprises a first validity bit of the first memory portion, and
   the second error detection circuit comprises a second validity bit of the second memory portion.

13. The information storage circuit of claim 12, wherein:
   the first error detection circuit is configured to reset or to mark as invalid the first memory portion when the first validity bit is not valid, and
   the second error detection circuit is configured to reset or to mark as invalid the second memory portion when the second validity bit is not valid.

14. The information storage circuit of claim 12, wherein:
each of the first and second memory portions comprises a plurality of storage cells, and each of the storage cells has a first capacitor having a first capacitance,
each of the first and second error detection circuits comprises a second capacitor having a second capacitance, and
the first capacitance is greater than the second capacitance.

15. The information storage circuit of claim 14, wherein each of the storage cells and the first and second error detection circuits comprises:
a first switch coupled between an internal supply and the first/second capacitor;
a first AND gate having an information input, a gating input, and a write high output coupled to the first switch;
a second switch coupled in parallel with the first/second capacitor, and also coupled between the storage cell output and a third switch;
a second AND gate having an information input, a gating input, and a write low output coupled to a second switch; and
the third switch coupled between the second switch and ground, and controlled by a reset signal.

16. A system, comprising:
an information storage circuit comprising:
a first memory portion configured to store information;
a second memory portion configured to store information; and
an error detection portion comprising:
a reset circuit coupled to the first memory portion, and configured to reset the first memory portion after a predetermined period of time;
a first error detection circuit coupled to the first memory portion, and configured to reset the first memory portion when the first error detection circuit detects an error in the first memory portion; and
a second error detection circuit coupled to the second memory portion, and configured to reset the second memory portion when the second error detection circuit detects an error in the second memory portion,
wherein the information storage circuit is configured to store information for the predetermined period of time without a power supply; and
a device configured to perform at least a portion of a predefined startup procedure when a last power-down time of the system is greater than a second predetermined period of time.

17. The device of claim 16, further comprising at least one of a magnetic field sensor, a current sensor, a pressure sensor, a temperature sensor, and an acceleration sensor for measuring the physical quantity.

18. The device of claim 16, wherein the device is an integrated circuit.

* * * * *